US012660121B2

(12) United States Patent
Chi et al.

(10) Patent No.: US 12,660,121 B2
(45) Date of Patent: Jun. 16, 2026

(54) WATER-COOLING HEAT DISSIPATOR HAVING EXPANDING MECHANISM

(71) Applicant: SILVERSTONE TECHNOLOGY CO., LTD., New Taipei City (TW)

(72) Inventors: Yen-Shu Chi, New Taipei City (TW); Kuan-Yu Liu, New Taipei City (TW)

(73) Assignee: SILVERSTONE TECHNOLOGY CO., LTD., New Taipei City (TW)

( * ) Notice: Subject to any disclaimer, the term of this patent is extended or adjusted under 35 U.S.C. 154(b) by 371 days.

(21) Appl. No.: 18/140,599

(22) Filed: Apr. 27, 2023

(65) Prior Publication Data

US 2024/0324139 A1    Sep. 26, 2024

(30) Foreign Application Priority Data

Mar. 22, 2023    (TW) .................................. 112202575

(51) Int. Cl.
*H05K 7/20*            (2006.01)
(52) U.S. Cl.
CPC ..... *H05K 7/20272* (2013.01); *H05K 7/20172* (2013.01)
(58) Field of Classification Search
CPC ........................ H05K 7/20272; H05K 7/20172
USPC ............................................ 165/80.4, 104.33
See application file for complete search history.

(56) References Cited

U.S. PATENT DOCUMENTS

| 6,668,911 | B2 * | 12/2003 | Bingler ................. | F28F 13/125 |
| | | | | 174/15.1 |
| 10,153,226 | B1 * | 12/2018 | Zou ........................ | H01L 23/467 |
| 11,073,648 | B2 * | 7/2021 | Huang ................. | G02B 6/0036 |
| 2003/0228840 | A1 * | 12/2003 | Gough ............... | H05K 7/20172 |
| | | | | 454/184 |
| 2006/0237172 | A1 * | 10/2006 | Lo ......................... | F28D 1/0471 |
| | | | | 361/698 |
| 2019/0104641 | A1 * | 4/2019 | Fan .......................... | G06F 1/20 |

* cited by examiner

*Primary Examiner* — Joel M Attey
(74) *Attorney, Agent, or Firm* — HDLS IPR SERVICES; Chun-Ming Shih

(57)            ABSTRACT

A water-cooling heat dissipator having an expanding mechanism includes: a water-cooling head having a main body a water inlet joint communicating with the main body and a water outlet joint communicating with main body, and the main body has a first connector; a fan module disposed on the water-cooling head and having a base and a fan, the base is connected to the main body and has a second connector electrically connected to the first connector and the fan, the fan is connected to the base and has a fan wheel formed outside the main body; and an expanding module disposed on the fan module. Accordingly, a heat dissipating requirement is provided to heat-generating electronic unit disposed at a periphery of the central processing unit, and an expanding function is provided.

9 Claims, 9 Drawing Sheets

WATER-COOLING HEAT DISSIPATOR HAVING EXPANDING MECHANISM

BACKGROUND OF THE DISCLOSURE

Technical Field

The present disclosure relates to a water-cooling heat dissipator, especially to a water-cooling heat dissipator having an expanding mechanism.

Description of Related Art

With the calculating speed of a heat-generating electronic unit, for example a central processing unit, disposed in an electronic product is being constantly increased, the generated heat is also higher and higher. As such, a related-art air-cooling heat dissipator may not reach the heat dissipating requirement in the current stage, and a water-cooling heat dissipator having a working fluid such as water used for achieving a circulative cooling effect is desired to perform a high-efficient heat dissipation for the heat-generating electronic unit.

The related-art water-cooling heat dissipator has solved the disadvantages of the air-cooling heat dissipator, but the related-art water-cooling heat dissipator still have the following problems. Because a fan is mostly disposed on a top end or inside a heat dissipation body, the heat dissipating operation may only be provided to single heat-generating electronic unit, and other heat-generating electronic units disposed at the periphery thereof still have a problem of heat accumulation or heat concentration, thus the heat dissipating operation is limited to a certain area of the whole system. Moreover, the related-art water-cooling heat dissipator is not provided with an expanding function to be applied to a user, thus the operating requirements required by most of the users may not be satisfied. As such, the aforesaid disadvantages of the related-art water-cooling heat dissipator shall be improved.

Accordingly, the applicant of the present disclosure has devoted himself for improving the mentioned shortages.

SUMMARY OF THE DISCLOSURE

The present disclosure is to provide a water-cooling heat dissipator having an expanding mechanism, in which a heat dissipating requirement is provided to a heat-generating electronic unit disposed at a periphery of the central processing unit, and an expanding function is provided corresponding to different operating needs.

Accordingly, the present invention provides a water-cooling heat dissipator having an expanding mechanism, which includes a water-cooling head, a fan module and an expanding module. The water-cooling head includes a main body a water inlet joint communicating with the main body and a water outlet joint communicating with main body, and the main body has a first connector. The fan module is disposed on the water-cooling head, and the fan module has a base and a fan. The base is connected to the main body and has a second connector electrically connected to the first connector and the fan. The fan is connected to the base and has a fan wheel formed outside the main body. The expanding module is disposed on the fan module.

Advantages achieved by the present disclosure are as follows. Expanding functions, for example providing lighting and displaying relevant parameters such as the operating data and the temperature are provided according to actual operation needs. The location of the fan is easily adjusted for providing a direct heat dissipating airflow to satisfy the heat dissipating requirement of the central processing unit and other heat-generating electronic units disposed at the periphery of the central processing unit, and other peripheral relevant units are prevented from being impacted or interfered.

BRIEF DESCRIPTION OF THE DRAWINGS

The features of the disclosure believed to be novel are set forth with particularity in the appended claims. The disclosure itself, however, may be best understood by reference to the following detailed description of the disclosure, which describes a number of exemplary embodiments of the disclosure, taken in conjunction with the accompanying drawings, in which:

DETAILED DESCRIPTION OF THE DISCLOSURE

The technical contents of this disclosure will become apparent with the detailed description of embodiments accompanied with the illustration of related drawings as follows. It is intended that the embodiments and drawings disclosed herein are to be considered illustrative rather than restrictive.

Please refer from FIG. 1 to FIG. 4, the present disclosure provides a water-cooling heat dissipator having an expanding mechanism, which mainly includes a water-cooling head 10, a fan module 20 and an expanding module 30.

Figure 2:
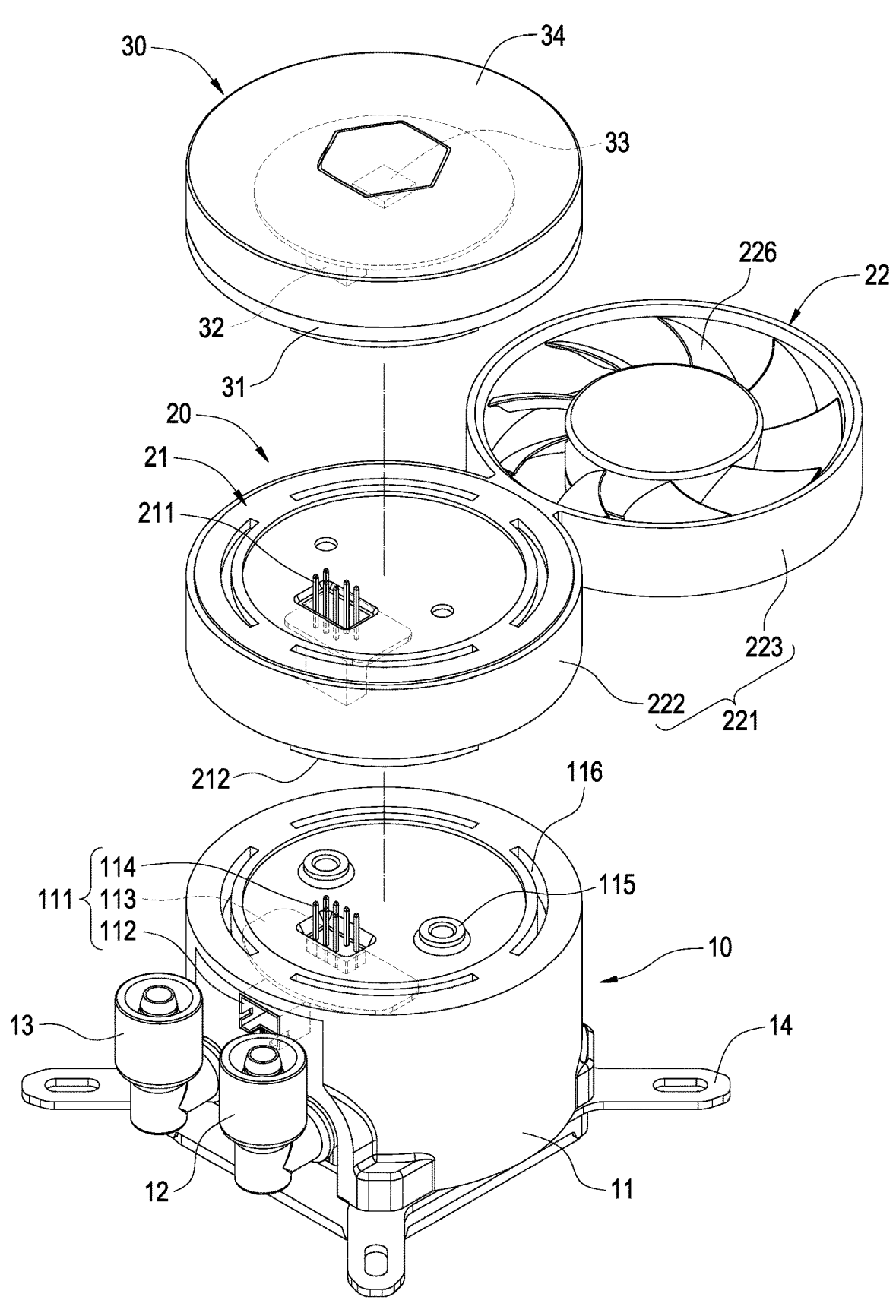
FIG. 2 is an exploded view showing the water-cooling heat dissipator according to the present disclosure.
Figure 3:
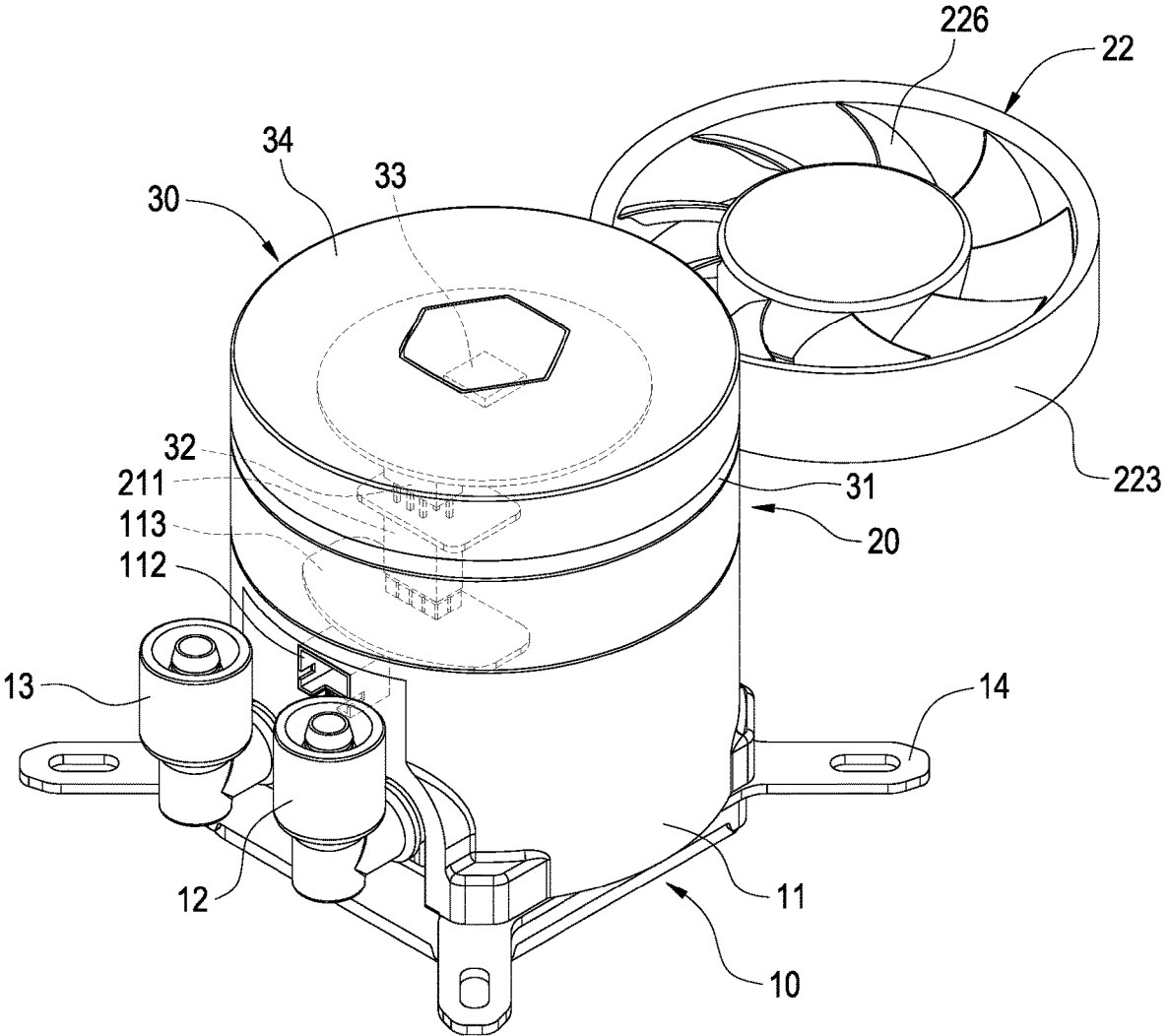
FIG. 3 is a perspective view showing the assembly of the water-cooling heat dissipator according to the present disclosure.

Please refer to FIG. 2 and FIG. 3, the water-cooling head 10 mainly includes a main body 11, a water inlet joint 12 and a water outlet joint 13. The main body 11 is arranged to be adjacent to a heat-generating electronic unit, for example a central processing unit (CPU), to dissipate the heat, and relevant components, for example a heat exchange chamber, a liquid flowing channel and a pump, are disposed in the main body 11. A first connector 111 is disposed at a top end of the main body 11. The first connector 111 mainly includes a socket 112, a circuit board 113 and a plurality of conductive terminals 114. Each of the conductive terminals 114 is electrically connected to the socket 112 through a circuit disposed on the circuit board 113. The socket 112 is disposed at one side of the main body 11. Each of the conductive terminals 114 is disposed on a top surface of the main body 11. The main body 11 further includes a plurality of mounting slots 116 and a plurality of positioning pieces 115 disposed on the top surface of the main body 11. The mounting slots 116 are symmetrically arranged with intervals. The positioning pieces 115 are arranged on a central line of the main body 11 and spaced with intervals. The water inlet joint 12 is connected to the main body 11 and in communication with the main body 11. The water outlet joint 13 is connected to the main body 11 and in communication with the main body 11. The water outlet joint 13 is disposed at one side of the water inlet joint 12.

In some embodiments, the water-cooling head 10 further includes a fastening rack 14. The fastening rack 14 is fastened at a bottom end of the main body 11.

Figure 1:
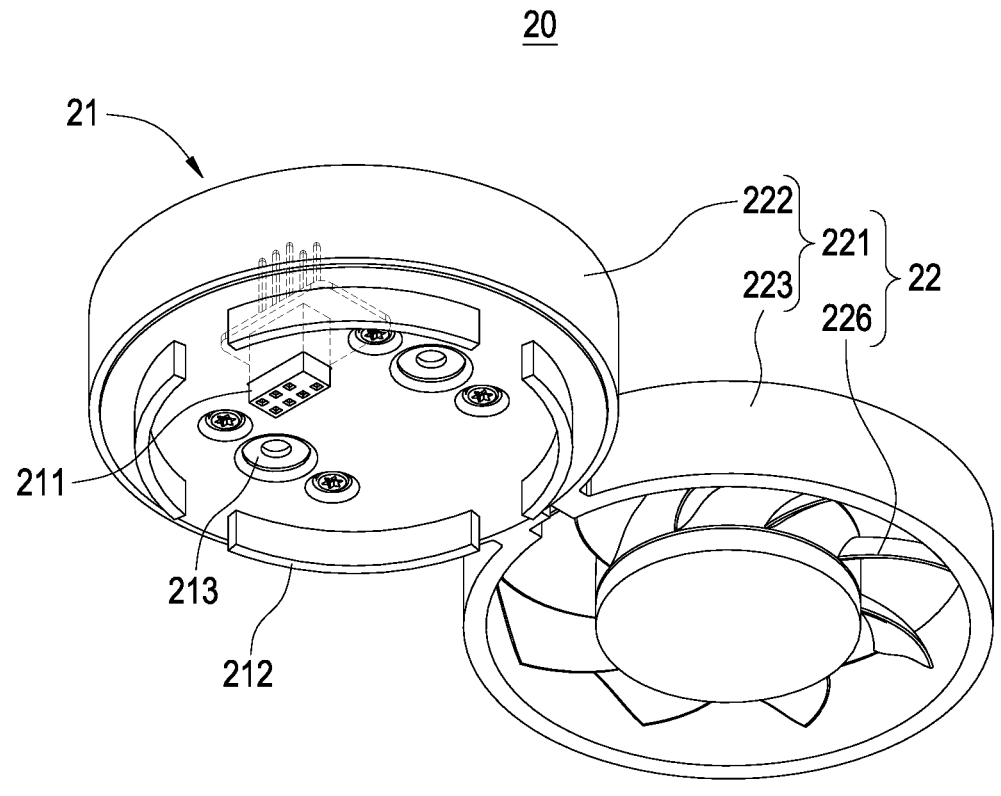
FIG. 1 is a perspective view showing the fan module according to the present disclosure.

Please refer to FIG. 1, the fan module 20 is disposed on the water-cooling head 10. The fan module 20 mainly includes a base 21 and a fan 22. The base 21 is substantially formed as a round member and connected to the main body 11. The base 21 includes a second connector 211. The second connector 211 includes components, for example a socket, a circuit board and conductive terminals. The first connector 111 is correspondingly inserted in the second connector 211 to establish an electric connection. The fan 22 is rotatably connected to the base 21. The fan 22 mainly includes a frame 221 and a fan wheel 226. The frame 221 mainly includes a first ring 222 and a second ring 223 connected to the first ring 222. The second ring 223 and the first ring 222 are parallelly arranged. The first ring 222 sheathes the base 21 and rotates relative to the base 21. The fan wheel 226 is disposed in the second ring 223, and electrically connected with the second connector 211 via a conductive wire (not shown in figures). The fan wheel 226 is disposed at an outer side of the main body 11.

In some embodiments, the base 21 further includes a plurality of mounting plates 212 and a plurality of positioning slots 213. Each of the mounting plates 212 is correspondingly mounted in each of the mounting slots 116. Each of the positioning slots 213 is used for accommodating each of the positioning pieces 115.

In some embodiments, the expanding module 30 is a light emitting member as shown in FIG. 2 and FIG. 3. The expanding module 30 is disposed on the fan module 20 and electrically connected to the fan module 20. The expanding module 30 mainly includes a seat plate 31, a third connector 32, a light emitting device 33 and a light-penetrable cover 34. The third connector 32 is fastened on the seat plate 31, and includes components such as a socket, a circuit board and conductive terminals. The third connector 32 is electrically connected to the second connector 211. The light emitting device 33 is disposed on the circuit board and electrically connected to the third connector 32. The light-penetrable cover 34 covers the light emitting device 33 and the light-penetrable cover 34 is connected to the seat plate 31.

Figure 4:
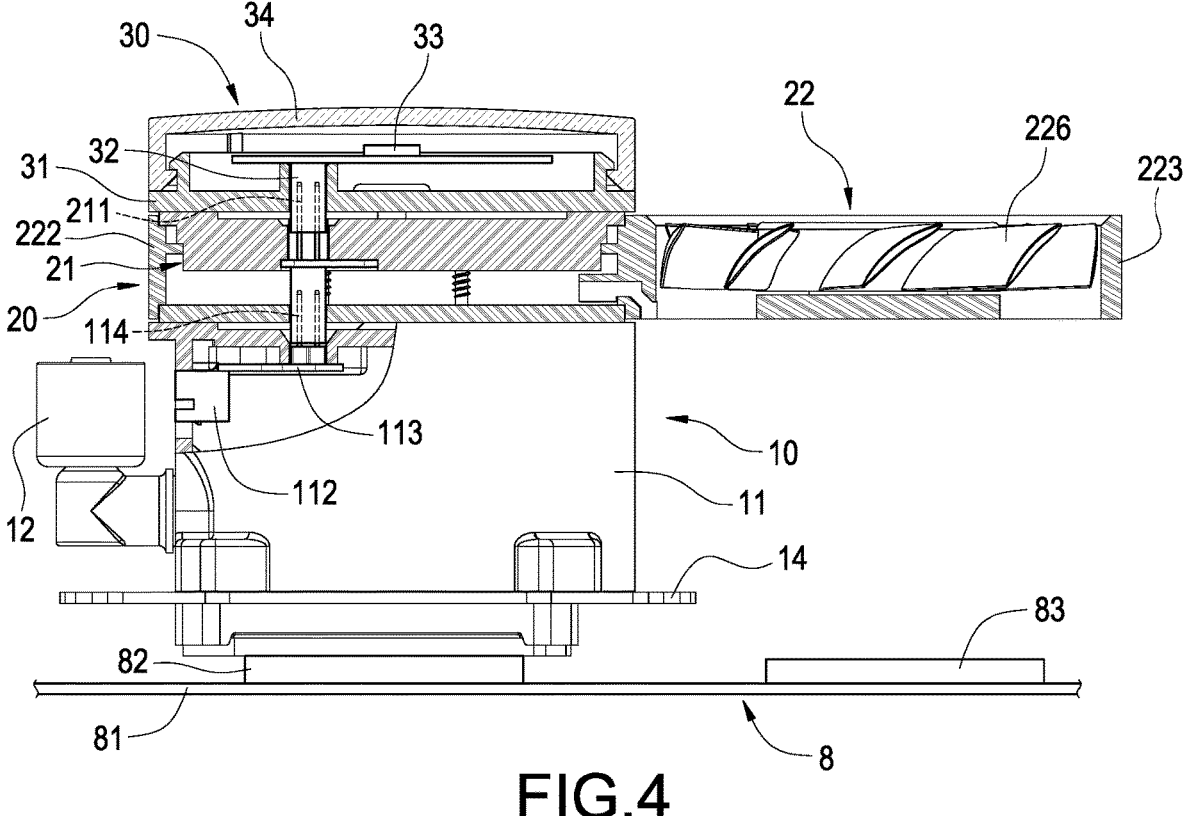
FIG. 4 is a cross sectional view showing the water-cooling heat dissipator being applied on a motherboard according to the present disclosure.

Please refer to FIG. 4, when being operated, the water-cooling heat dissipator of the present disclosure is disposed on a motherboard 8. The motherboard 8 has a circuit board 81, a central processing unit 82 disposed on the motherboard 81 and other heat-generating electronic units 83 (for example a southbridge chip, a northbridge chip, a graphics card module, a transformer, and an electric connector, etc.). Each of the heat-generating electronic unis 83 is disposed at a peripheral area of the central processing unit 82. The main body 11 of the water-cooling head 10 is arranged to be adjacent on a top surface of the central processing unit 82, and penetrates the circuit board 81 through locking components, for example screw bolts, to be fastened with the fastening rack 14. When a heat dissipating requirement is needed by the heat-generating electronic units 83, the fan wheel 226 is located at a location defined above each of the heat-generating electronic units 83 through rotating the direction of the frame 221, thus a direct heat dissipating airflow is provided. The expanding module 30 is used for providing an internal lighting function in a mainframe case (not shown in figures).

Figure 5:
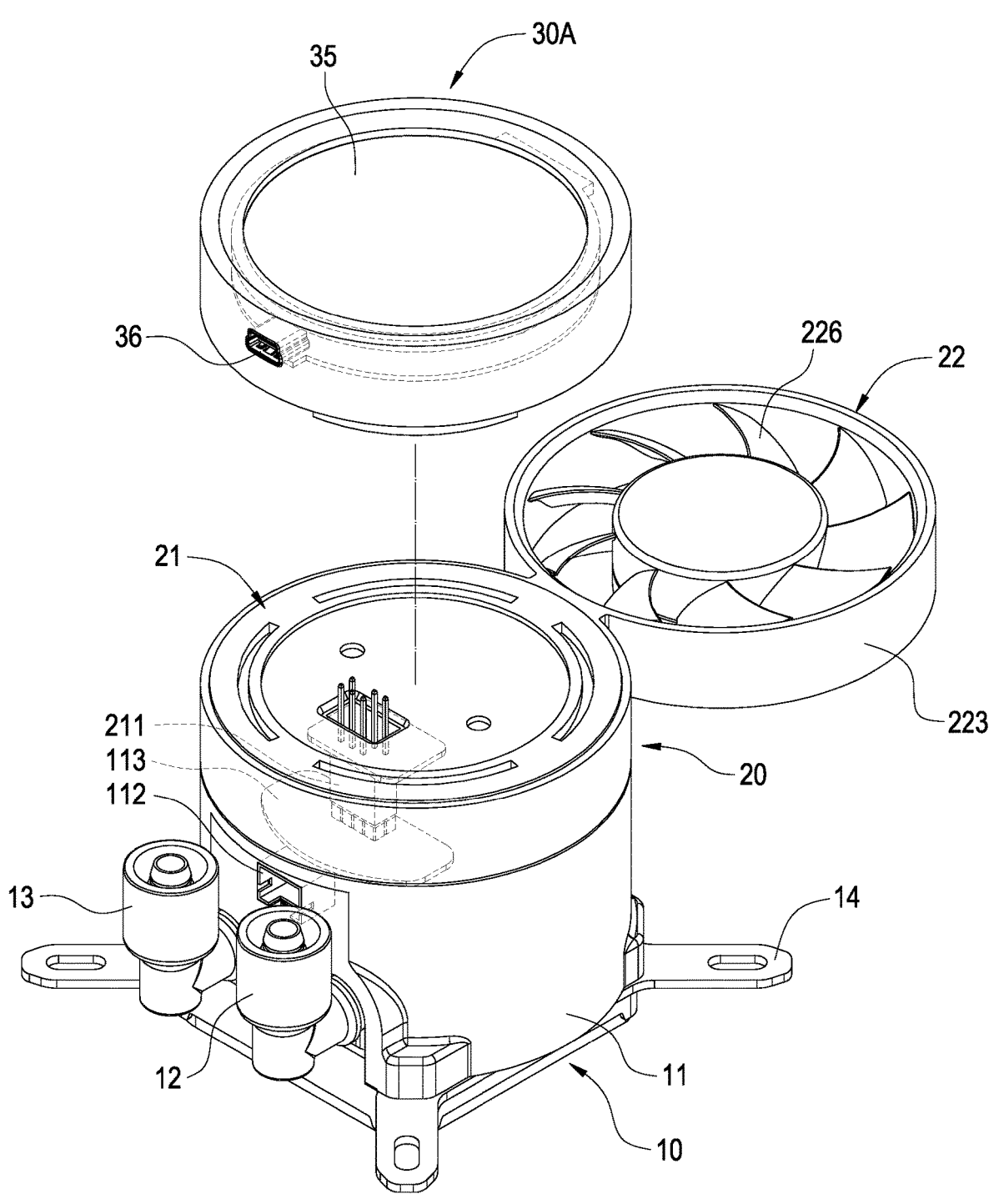
FIG. 5 is an exploded view showing the water-cooling heat dissipator according to another embodiment of the present disclosure.
Figure 6:
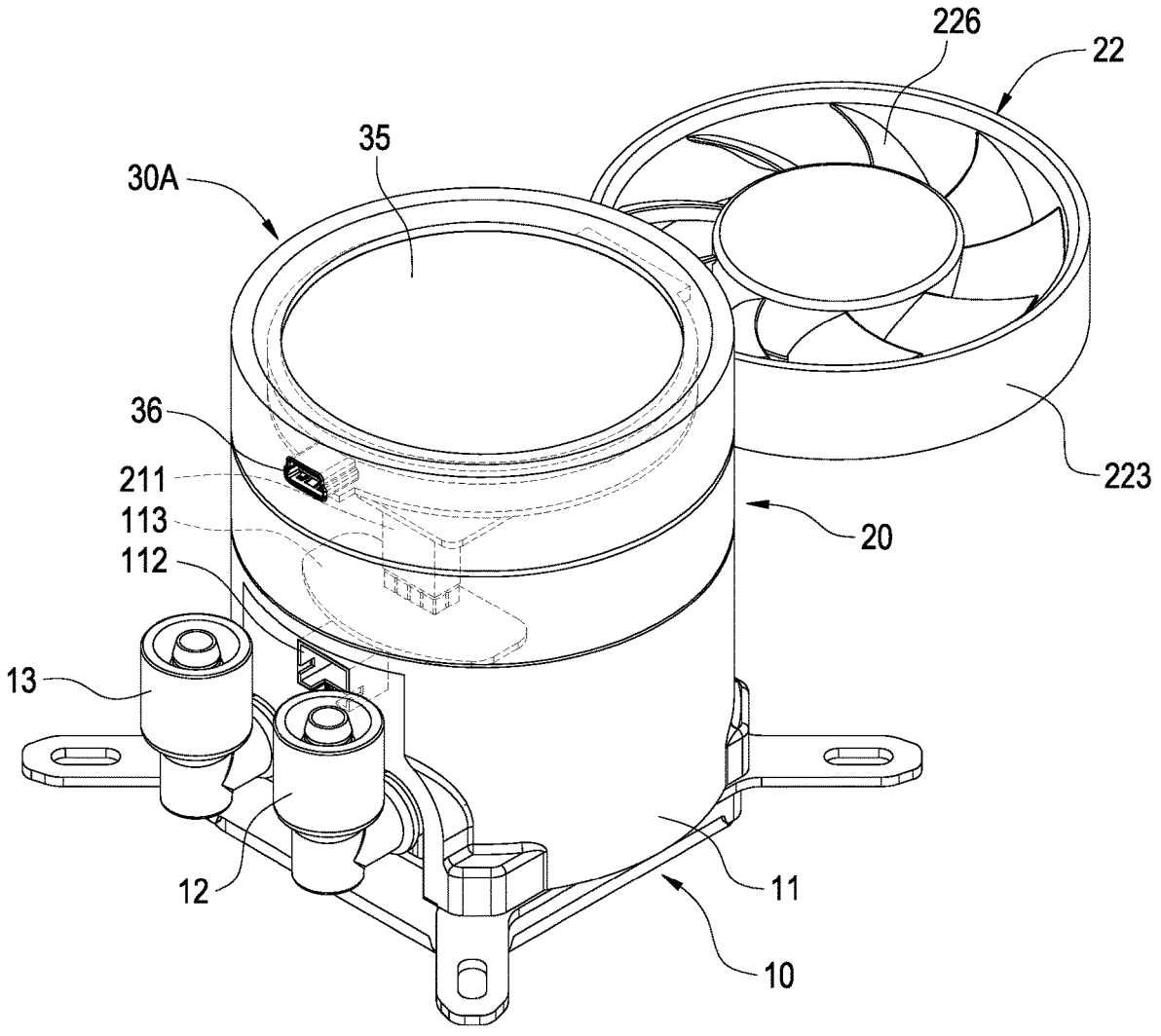
FIG. 6 is a perspective view showing the assembly of the water-cooling heat dissipator according to another embodiment of the present disclosure.

In some embodiments, an expanding module 30A is a display member as shown in FIG. 5 and FIG. 6. The expanding module 30A is disposed on the fan module 20. The expanding module 30A mainly includes a display screen 35 and a connection port 36 electrically connected to the display screen 35. The connection port 36 allows a connection wire (not shown in figures) to be inserted and connected. The display screen 35 is used for providing relevant parameters, for example a rotation speed and a temperature, of each assembled component.

Figure 7:
FIG. 7 is an exploded view showing the water-cooling heat dissipator according to one another embodiment of the present disclosure.
Figure 8:
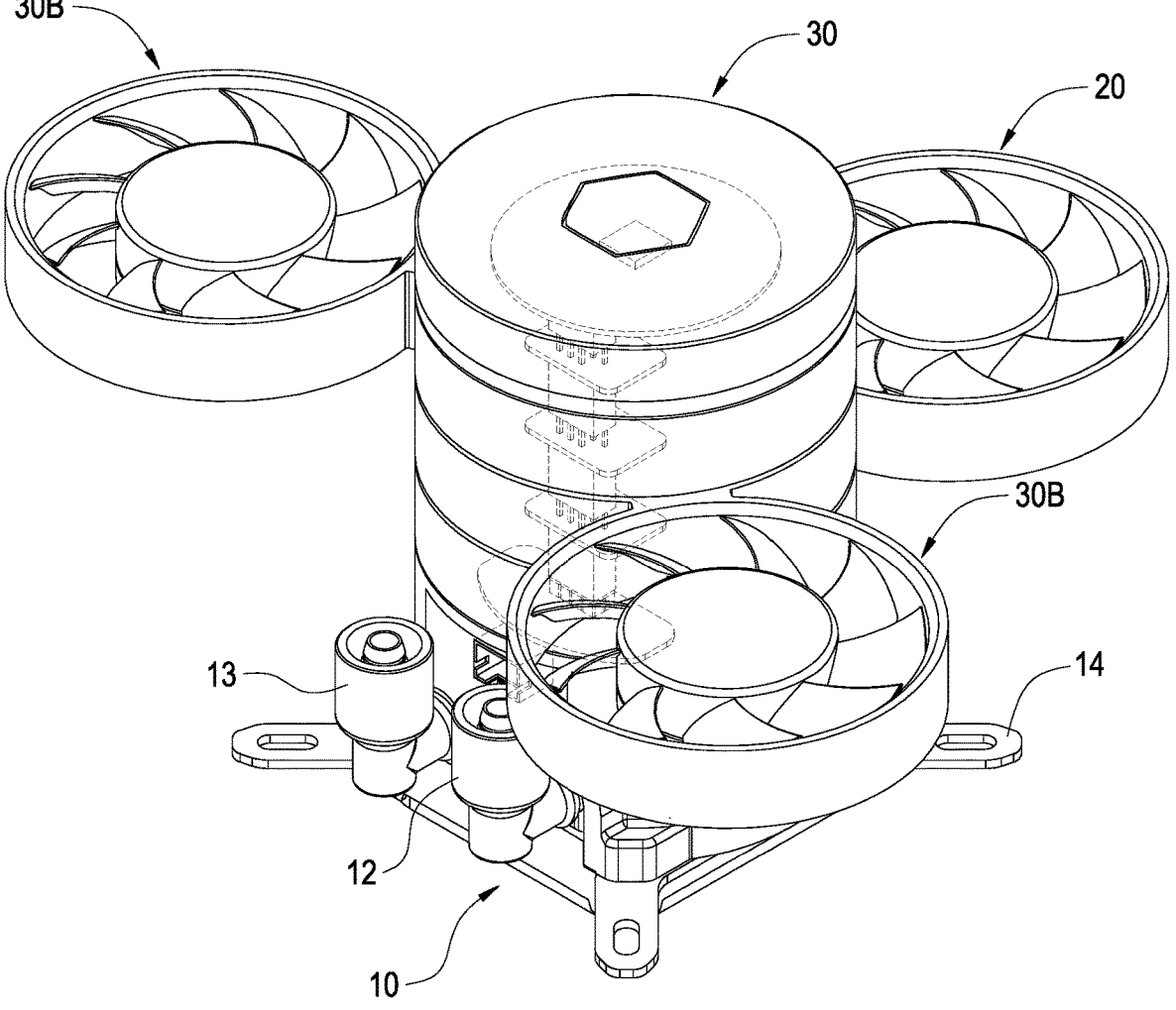
FIG. 8 is a perspective view showing the assembly of the water-cooling heat dissipator according to one another embodiment of the present disclosure.

In some embodiments, a plurality of expanding modules 30B, besides the expanding module 30, are further provided as shown in FIG. 7 and FIG. 8. Each of the expanding modules 30B is a fan member. The expanding modules 30B are sequentially stacked on the fan module 20 and electrically connected to the fan module 20. The expanding module 30 is stacked on the expanding modules 30B and electrically connected to one of the expanding modules 30B adjacent to the expanding module 30. The detailed structure of the expanding module 30B is the same as that of the fan module 20, thus the technical features are omitted for brevity. The amounts of expanding modules 30B may be increased with a manner of equal to or more than two units or increased with a manner of single unit. As such, the direct heat dissipating airflows are provided at multiple locations according to actual heat dissipating needs, and an internal lighting function is provided in the mainframe case.

Figure 9:
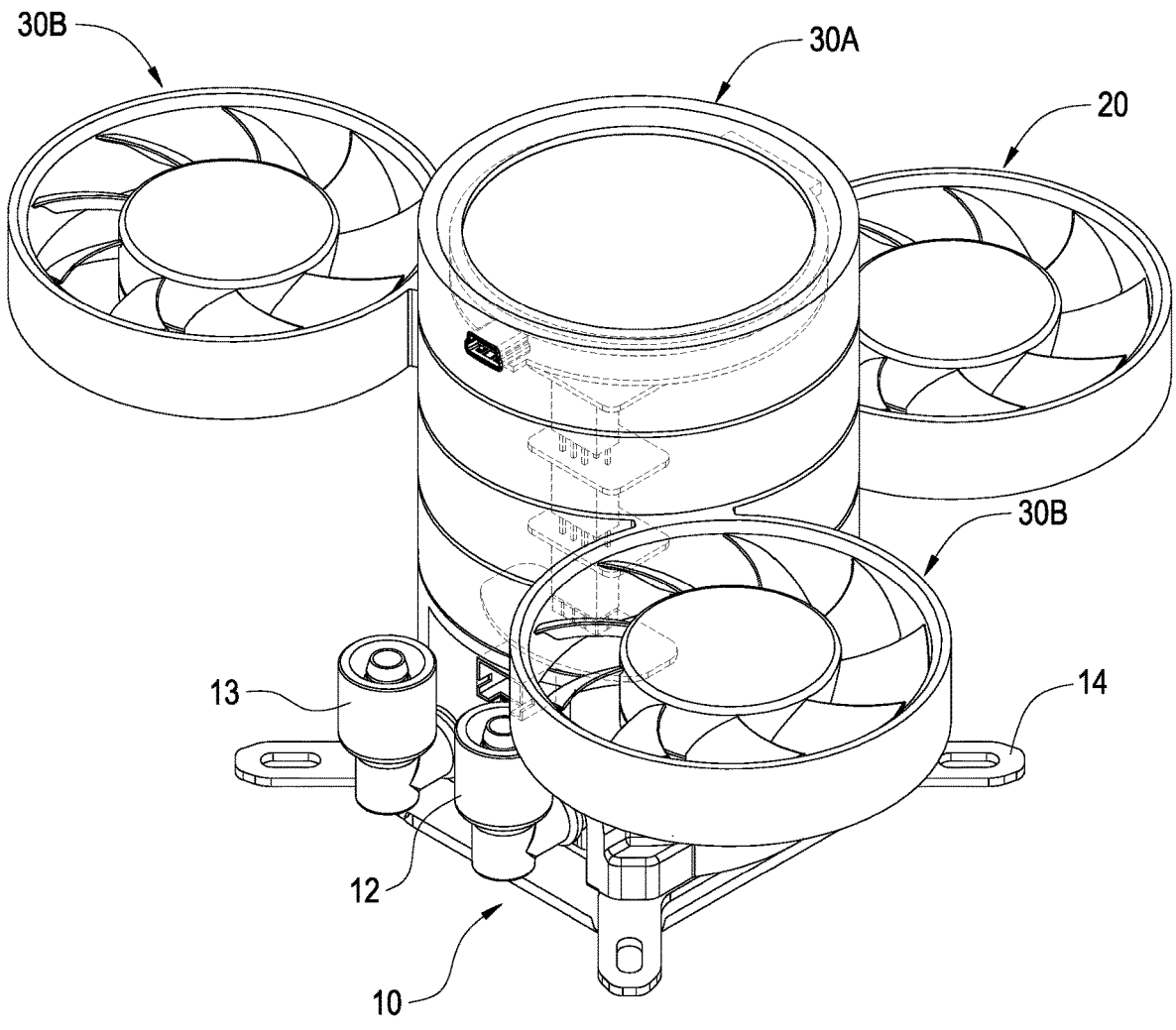
FIG. 9 is a perspective view showing the assembly of the water-cooling heat dissipator according to one other embodiment of the present disclosure.

In some embodiments, the expanding modules 30B are sequentially stacked on the fan module 20 and electrically connected to the fan module 20 as shown in FIG. 9, and the expanding module 30A is stacked on the expanding module 30B located at the top. Accordingly, the direct heat dissipating airflows are provided at multiple locations according to actual heat dissipating needs, and the relevant parameters, for example the rotation speed and the temperature, of each component are provided.

While this disclosure has been described by means of specific embodiments, numerous modifications and variations could be made thereto by those skilled in the art without departing from the scope and spirit of this disclosure set forth in the claims.

What is claimed is:

1. A water-cooling heat dissipator, comprising:
   a water-cooling head, comprising a main body, a water inlet joint communicating with the main body and a water outlet joint communicating with the main body, wherein the main body comprises a first connector;
   a fan module, disposed on the water-cooling head and comprising a base and a fan, wherein the base is stacked on the main body and comprises a second connector electrically connected to the first connector and the fan, the fan is connected to the base and comprises a fan wheel disposed outside the main body; and at least one of a light emitting member and a fan member, disposed on the fan module;

wherein the fan comprises a frame, the frame comprises a first ring and a second ring connected to the first ring, the second ring and the first ring are parallelly arranged, the first ring is adapted to rotatably sheathe the base, and the fan wheel is disposed in the second ring.

2. The water-cooling heat dissipator according to claim 1, wherein the light emitting member is stacked on the fan module and electrically connected to the fan module.

3. The water-cooling heat dissipator according to claim 2, wherein the light emitting member comprises a seat plate, a third connector, a light emitting device and a light-penetrable cover, the third connector is fastened on the seat plate and electrically connected to the second connector, the light emitting device is electrically connected to the third connector, and the light-penetrable cover covers the light emitting device and is connected to the seat plate.

4. The water-cooling heat dissipator according to claim 1, wherein a display member is stacked on the fan module, and comprises a display screen and a connection port electrically connected to the display screen.

5. The water-cooling heat dissipator according to claim 1, wherein a display member and the fan member are stacked on the fan module.

6. The water-cooling heat dissipator according to claim 1, wherein the base comprises a plurality of mounting plates and a plurality of positioning slots, the main body comprises a plurality of mounting slots and a plurality of positioning pieces, each of the mounting plates is correspondingly mounted in each of the mounting slots, and each of the positioning pieces is accommodated in each of the positioning slots.

7. The water-cooling heat dissipator according to claim 1, wherein the first connector comprises a socket, a circuit board and a plurality of conductive terminals, each of the conductive terminals is electrically connected to the socket through the circuit board, the socket is disposed on one side of the main body, and each of the conductive terminals is disposed on a top surface of the main body.

8. A water-cooling heat dissipator, comprising:

a water-cooling head, comprising a main body, a water inlet joint communicating with the main body and a water outlet joint communicating with the main body, wherein the main body comprises a first connector;

a fan module, disposed on the water-cooling head and comprising a base and a fan, wherein the base is stacked on the main body and comprises a second connector electrically connected to the first connector and the fan, the fan is connected to the base and comprises a fan wheel disposed outside the main body; and wherein a fan member is stacked on the fan module and electrically connected to the fan module.

9. A water-cooling heat dissipator, comprising:

a water-cooling head, comprising a main body, a water inlet joint communicating with the main body and a water outlet joint communicating with the main body, wherein the main body comprises a first connector;

a fan module, disposed on the water-cooling head and comprising a base and a fan, wherein the base is stacked on the main body and comprises a second connector electrically connected to the first connector and the fan, the fan is connected to the base and comprises a fan wheel disposed outside the main body; and wherein a light emitting member and a fan member are stacked on the fan module.

* * * * *